(12) United States Patent
Esmark et al.

(10) Patent No.: US 8,076,728 B2
(45) Date of Patent: Dec. 13, 2011

(54) INTEGRATED CIRCUIT ARRANGEMENTS WITH ESD-RESISTANT CAPACITOR AND CORRESPONDING METHOD OF PRODUCTION

(75) Inventors: Kai Esmark, Neuried (DE); Harald Gossner, Riemerling (DE); Christian Russ, Diedorf (DE); Jens Schneider, München (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 12/511,845

(22) Filed: Jul. 29, 2009

(65) Prior Publication Data

US 2009/0283810 A1 Nov. 19, 2009

Related U.S. Application Data

(63) Continuation of application No. 11/502,262, filed on Aug. 10, 2006, now abandoned.

(51) Int. Cl.
*H01L 23/62* (2006.01)
(52) U.S. Cl. .................. 257/355; 257/E29.345
(58) Field of Classification Search .................. 257/355, 257/E29.345
See application file for complete search history.

(56) References Cited

U.S. PATENT DOCUMENTS

| | | | |
|---|---|---|---|
| 5,264,723 A * | 11/1993 | Strauss ...................... | 257/532 |
| 5,576,565 A | 11/1996 | Yamaguchi et al. | |
| 5,608,258 A | 3/1997 | Rajkanan et al. | |
| 5,656,834 A | 8/1997 | Grzyb et al. | |
| 5,719,066 A | 2/1998 | Sano et al. | |
| 6,034,388 A | 3/2000 | Brown et al. ................. | 257/296 |
| 6,097,069 A | 8/2000 | Brown et al. ................. | 257/374 |
| 6,285,052 B1 * | 9/2001 | Draper ........................ | 257/300 |
| 6,351,020 B1 | 2/2002 | Tarabbia et al. | |
| 6,436,771 B1 | 8/2002 | Jang et al. | |
| 6,544,845 B2 | 4/2003 | Yoo et al. | |
| 6,828,654 B2 * | 12/2004 | Tam et al. .................... | 257/532 |
| 6,949,806 B2 | 9/2005 | Wu et al. ...................... | 257/412 |
| 2002/0140109 A1 | 10/2002 | Keshavarzi et al. | |

FOREIGN PATENT DOCUMENTS

| | | |
|---|---|---|
| DE | 41 37 081 A1 | 6/1996 |
| GB | 2 250 378 A | 9/1991 |
| JP | 2003-031808 | 1/2003 |

OTHER PUBLICATIONS

Sze, Simon M., *Semiconductor Devices: Physics and Technology*, $2^{nd}$ Edition, p. 374.
Office Action in the Republic of China dated Apr. 25, 2008, for corresponding patent application No. 200580012310.4.
Office Action in the Republic of China dated Dec. 30, 2010, for corresponding patent application No. 200910174780.0.
Office Action for U.S. Appl. No. 12/511,835 dated Oct. 5, 2010.

* cited by examiner

*Primary Examiner* — Hoai V Pham
*Assistant Examiner* — Tanika Warrior

(57) ABSTRACT

A circuit arrangement including a capacitor in an n-type well is disclosed. A specific polarization of the capacitor ensures that a depletion zone arises in the well and the capacitor has a high ESD strength. An optionally present auxiliary doping layer ensures a high area capacitance of the capacitor despite high ESD strength.

9 Claims, 3 Drawing Sheets ated voltage or below the ground potential in the case of a reverse ESD polarity is exceeded, becomes readily conductive, e.g. a protection diode, a MOS transistor, a bipolar transistor, a thyristor, a zener diode, a diode stack, etc. or combinations thereof.

INTEGRATED CIRCUIT ARRANGEMENTS WITH ESD-RESISTANT CAPACITOR AND CORRESPONDING METHOD OF PRODUCTION

PRIORITY CLAIM

This application is a continuation application of commonly-assigned U.S. patent application Ser. No. 11/502,262, filed Aug. 10, 2006, which is a continuation of International Patent Application PCT/EP2005/050398, filed Jan. 31, 2005, and which claims the benefit of priority German Patent Application No. DE 102004006484.9, filed Feb. 10, 2004, the contents of all of which are incorporated by reference in their entirety.

BACKGROUND

1. Technical Field

The invention relates to a circuit for electrostatic discharge (ESD) protection. In particular, the invention relates to an ESD protection circuit with an ESD-resistant capacitor.

2. Background Information

ESD cases occur particularly when the circuit arrangement is not yet in the state ready for operation, that is to say during the fabrication of the circuit arrangement, during incorporation into a chip housing or during mounting onto a printed circuit board. By way of example, an ESD voltage pulse has a voltage of greater than 100 volts and a duration of approximately 100 nanoseconds.

Capacitors may be used for ESD protection. Such capacitors are used in particular for circuits with analog signal processing. Said capacitors are also referred to as decoupling capacitors, blocking capacitors or backup capacitors. The capacitors decouple and stabilize the supply voltage of the integrated circuit arrangement.

BRIEF SUMMARY OF THE INVENTION

An integrated circuit arrangement includes a reference operating potential line, which carries a basic potential, e.g. a ground potential, during operation of the circuit arrangement, and comprising a positive operating potential line, which carries a more positive potential in comparison with the basic potential, e.g. a positive potential, during operation of the circuit arrangement. Moreover, the integrated circuit arrangement contains a capacitor connected between the operating potential lines.

The capacitor can be embodied as a so-called N well Capacitor (NCAP) or a P well capacitor (PCAP) and then contains the following regions: a basic doping region doped in accordance with a basic doping type, at least one doped connection region which preferably adjoins the basic doping region and is doped in accordance with the basic doping type and the maximum dopant concentration of which is higher than the maximum dopant concentration in the basic doping region, an electrode region arranged at a distance from the basic doping region, said electrode region, following the construction of a Metal Oxide Semiconductor (MOS) transistor, also being referred to as a gate region, and a dielectric arranged between the electrode region and the basic doping region.

To protect the capacitor against Electrical Overstress (EOS) phenomena and in particular against ESD phenomena, the integrated circuit arrangement contains at least one protection element which is connected in parallel with the capacitor and, when a specific voltage lying above the operating voltage or below the ground potential in the case of a reverse ESD polarity is exceeded, becomes readily conductive, e.g. a protection diode, a MOS transistor, a bipolar transistor, a thyristor, a zener diode, a diode stack, etc. or combinations thereof.

The disclosure specifies integrated circuit arrangements each comprising at least one capacitor which, despite good electrical properties, remains functional even after loading with electrostatic discharges in the case of which capacitors used heretofore are damaged. In particular, a circuit arrangement is disclosed that is robust in the ESD case, or the geometry of said circuit arrangement. The disclosure also provides methods for the production of integrated circuit arrangements.

The disclosure is based on the consideration that NCAP or PCAP capacitors have a large capacitance per unit area, so that comparatively large capacitance values can be achieved even given a small chip area, for example in comparison with p-n junction capacitances. Moreover, the RC time constants of the capacitor are of importance. In many applications it is necessary in particular for the parasitic series resistance of the capacitor to be small.

For an NCAP or a PCAP, the dielectric must be as thin as possible to obtain a high capacitance per unit area. By way of example, the thickness of the dielectric is less than 2 nanometers, particularly in the case of technologies with minimum lithographic dimensions of less than 100 nanometers and operating voltages of less than 2 volts. Moreover, despite the circuitry interconnection with the ESD protection circuit, in the ESD case, voltages of a few volts, e.g. of 5 or 6 volts, build up across the dielectric. However, such a thin dielectric can then be damaged even by momentarily occurring voltages of 4 volts, which may lead to the failure of the entire integrated circuit arrangement.

Therefore, either given a basic doping region of the n basic doping type the connection region is electrically conductively connected to the positive operating potential line and the electrode region is electrically conductively connected to the reference operating potential line, or that given a p basic doping type the connection region is electrically conductively connected to the reference operating potential line and the electrode region is electrically conductively connected to the positive operating potential line.

In one example arrangement, an auxiliary doping region doped in accordance with an auxiliary doping with the basic doping type is arranged between the basic doping region and the dielectric, the maximum dopant concentration of said auxiliary doping region being equal to the maximum dopant concentration in the basic doping region or greater than said dopant concentration.

For an ESD voltage having a polarity for which the supplementarily connected protection circuit affords less protection, a so-called depletion of charge carriers occurs in the basic doping region and also in the optional auxiliary doping layer, that is to say that a so-called depletion layer is formed, which has a dielectric effect and thus leads to a larger effective dielectric thickness. If appropriate, the ESD voltage at the capacitor is so high that not only does a inversion channel. However, on account of the doping type of the connection region, no charge carriers that would decrease the effective dielectric thickness again pass into the inversion channel.

What is achieved by the auxiliary doping region and the specified polarization in the normal operating mode of the circuit arrangement is that the capacitance is not reduced to an excessively great extent by the relationships explained for the ESD case. In particular, by way of example, because of the auxiliary doping layer, the thickness of the depletion layer is smaller than without such an auxiliary doping layer.

Because the capacitor is connected between the operating potential lines, a large voltage is dropped across it in the ESD case because a voltage divider effect as in the case of a series circuit of transistors or capacitors does not occur. Such a series circuit occurs in particular in functional blocks where use is made e.g. of PMOS and NMOS connected in series as an inverter. In particular, the capacitor is contained in the core logic of the circuit arrangement, or in a so-called analog macroblock.

The circuit arrangement according to the disclosure is robust in the ESD case because the electric field strength is reduced in the dielectric or in the most jeopardized overlap regions between dielectric and connection regions or extension regions.

The auxiliary doping region therefore enables the ESD strength to be established better, without the thickness of the dielectric, e.g. of an oxide, having to be altered. Often there are only two dielectric thicknesses that can be chosen in a production process, so that, as a result of the auxiliary doping, a freely selectable and more finely adjustable optimization parameter is available and overdimensioning is avoided. In one arrangement, the auxiliary doping is not chosen entirely freely, but rather corresponds to one of the implantations available anyway in the process, of which different ones can be selected, however.

The auxiliary doping region may lie at the surface of a substrate and can therefore be easily introduced. In another refinement, the substrate is a monocrystalline substrate, in particular a silicon substrate. Such substrates have high purity. On account of the purity and the monocrystalline material, the substrates can carry a comparatively high field strength, which is of great importance in the ESD case, too, to prevent a breakdown. Moreover, the dopant concentration in the auxiliary doping region and also the doping profile can be established in a reproducible manner on account of the surface position, the purity and the monocrystalline material, in particular in a simple production process. The dopant concentration and the dopant profile of the basic doping region or auxiliary doping region are determining factors for the thickness of the depletion layer.

The doping of the auxiliary doping region is effected by using one implantation or by using a plurality of implantations, for example implantations which have been used hitherto in the process for producing the circuit arrangement for setting different threshold voltages of field effect transistors in each case in mutually different regions of the circuit arrangement. The doping of the auxiliary doping region is preferably superimposed on a well doping or basic doping. The use of a plurality or one selected implantation for setting the threshold voltage of a transistor also for producing the auxiliary doping region enables an optimization without additional steps, in particular an optimization of the thickness of the depletion layer that forms in the normal operating mode of the circuit arrangement and thus also of the voltage drop across the depletion layer. The lower the dopant concentration in the auxiliary doping region, the thicker the depletion layer and the greater the ESD robustness becomes. By contrast, a higher dopant concentration in the auxiliary doping region leads to a thinner depletion layer which, however, hardly impairs the capacitance per unit area during normal operation. However, even the thin depletion layer still enables sufficient ESD robustness.

Because of the polarization of the capacitor, with the use of an N type well (in the case of a P predoped substrate) or a P type well (for an N type substrate) for the basic doping region, there is also an additional p n junction capacitance with respect to the substrate in addition to the capacitance of the capacitor. The junction capacitance is connected in parallel with the capacitance of the capacitor, so that the capacitance per unit area is increased.

The breakdown strength of the capacitor can be increased further by suitable suicide blocking during the formation of silicide on the connection region and on the electrode region or the gate region.

The effects of the circuit arrangement are independent of the material used for the electrode region, and of a doping of the electrode region. Therefore, these effects can be obtained both in the case of polycrystalline electrode regions and in the case of electrode regions made of metal, in particular in future technologies.

Aspects of the described embodiments are based on the experimentally acquired insight that the most jeopardized part of the dielectric during an ESD discharge is the region in which the electrode region or the gate region overlaps the doped connection region or an extension region.

Only two or at most three different gate oxide thicknesses are available in a typical process. The circuit arrangement exploits this to form in a capacitor a dual dielectric containing a thin central region and a thicker edge region in comparison therewith. The choice of the width of the thicker edge region of the dielectric enables an optimization to be carried out in such a way that, on the one hand, the capacitance is not decreased excessively in comparison with the use of an exclusively thin dielectric and that, on the other hand, the ESD strength is sufficient without the occurrence of overdimensioning, as would be the case with an exclusively thick dielectric.

Furthermore, the disclosure relates to methods for the production of integrated circuit arrangements. There are various possibilities for forming the dual dielectric: the thin dielectric is formed simultaneously with a layer of the thick dielectric that is near the basic doping region. A further layer of the thick dielectric is subsequently produced, the thin dielectric being masked, e.g. by a resist layer. The thin dielectric may be formed completely prior to forming the thick dielectric. Afterward, the thin dielectric is masked and the thick dielectric is produced. The thin dielectric may be formed after forming a layer of the thick dielectric that is near the basic doping region, a further layer of the thick dielectric preferably being produced simultaneously.

Thermal oxidations, in particular, are suitable for forming the dielectrics. Regions at which the silicon is to be accessible are etched free later, by way of example.

BRIEF DESCRIPTION OF THE DRAWINGS

The invention is explained below with reference to the accompanying drawings, in which.

DETAILED DESCRIPTION OF THE DRAWINGS

Figure 1:
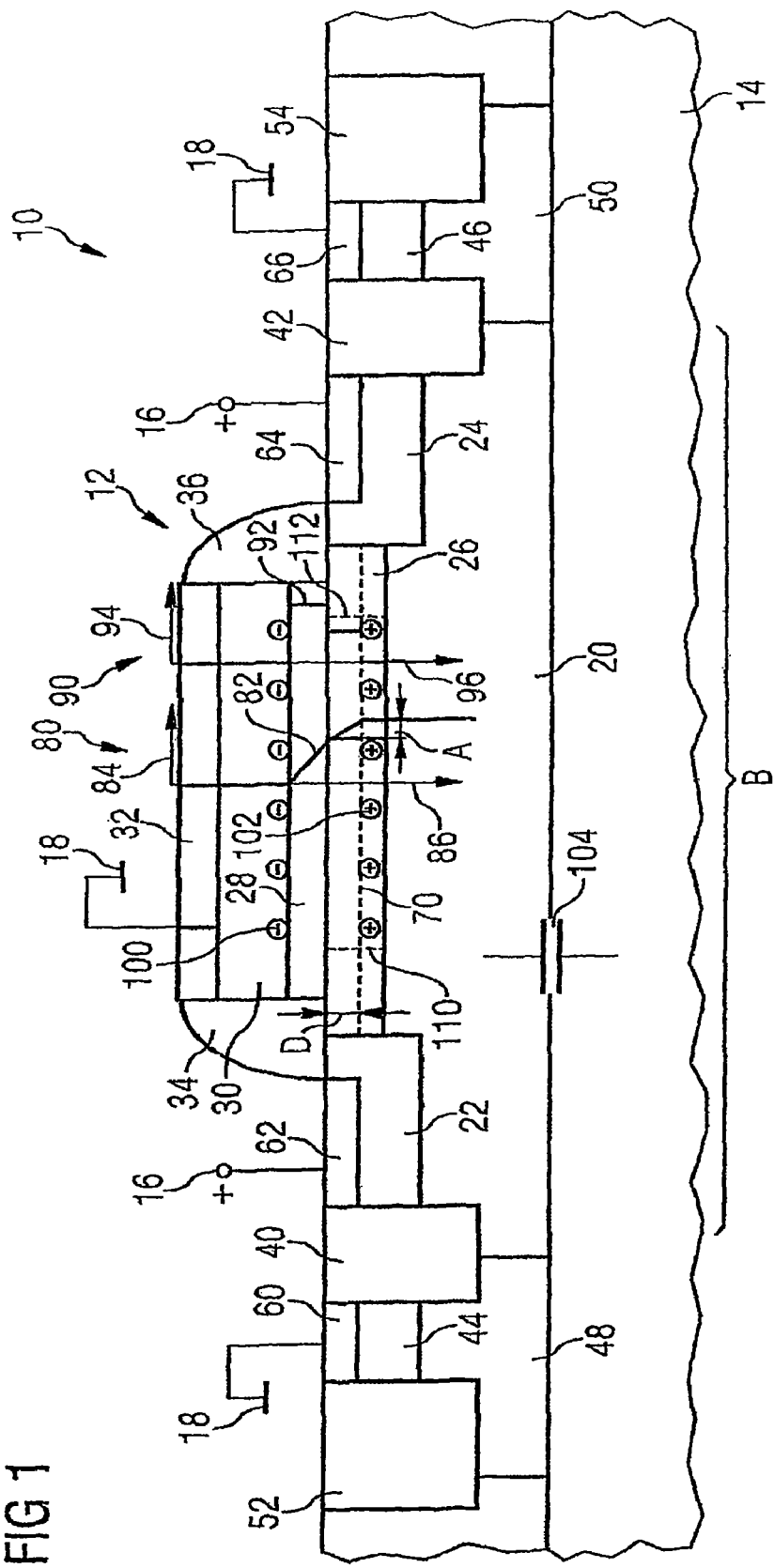
FIG. 1 shows an integrated circuit arrangement with an n-type well capacitor 12.

FIG. 1 shows an integrated circuit arrangement containing an ESD-resistant n-type well capacitor 12. The integrated circuit arrangement 10 additionally contains on a monocrystalline silicon substrate 14, which is lightly p-doped in an example arrangement, a positive line 16 leading to a positive connection pad, a ground line 18 leading to a ground connection pad, an ESD protection circuit (not illustrated), and a multiplicity of transistors (not illustrated), e.g. memory transistors or transistors of a logic circuit or an analog circuit, in particular field effect transistors.

The well capacitor 12 contains an n-doped well 20 having e.g. a maximum dopant concentration of $1\times10^{17}$ to $1\times10^{18}$ dopant atoms per cubic centimeter, e.g. phosphorus atoms or arsenic atoms. The well 20 has e.g. a depth of 1500 nanometers, a width B and a length of in each case typically up to 100 micrometers. The well capacitor 12 also includes heavily n-doped connection regions 22 and 24 or source/drain regions typically lying in each case along the longitudinal sides of the well 20, the maximum dopant concentration lying e.g. within the range of $1\times10^{20}$ to $10\times10^{21}$ dopant atoms per cubic centimeter. The connection regions 22, 24 have a depth of typically 200 nm in an example arrangement.

With increasing distance from the substrate 14, the capacitor 12 additionally contains, in the order specified below, an n-doped optional auxiliary doping region 26 between the connection regions 22 and 24. In an example arrangement, the auxiliary doping region 26 adjoins the connection region 22 on one side and the connection region 24 on the other side and extends between the two connection regions 22 and 24 without any interruption. As an alternative, the auxiliary doping region adjoins n-doped extension regions formed at the connection regions 22, 24. The extension regions are also referred to as Lightly Doped Drain (LDD) regions because their dopant concentration is lower than that of the connection regions 22, 24, but higher than that of the auxiliary doping region. The auxiliary doping region 26 has e.g. in a depth of 100 nanometers and a maximum dopant concentration within the range of $1\times10^{17}$ to $1\times10^{18}$ dopant atoms per cubic centimeter.

The capacitor 12 includes a dielectric 28 extending along the surface of the auxiliary doping region 26 and arranged at a distance from the connection regions 22, 24. The dielectric 28 is also referred to as a gate oxide (GOX) and comprises e.g. silicon dioxide ($\in r=3.9$) or a material having a relative permittivity of greater than 3.9, in particular a so-called high-k dielectric. In an example arrangement, the dielectric 28 has a thickness of two nanometers.

The capacitor 12 includes a gate region 30, which adjoins the dielectric 28 (toward the top), and which comprises doped polycrystalline silicon, e.g. n- or p-doped polysilicon having a maximum dopant concentration of greater than $5\ 10^{19}$ dopant atoms per cubic centimeter. The gate region 30 has a thickness within the range of e.g. 100 nanometers to 400 nanometers. A silicide region 32 extends on the gate region 28 and has e.g. a thickness of 40-60 nanometers.

In an example arrangement, the connection regions 22, 24 do not extend beneath the dielectric 28. The stack formed from the dielectric 28, the gate region 30 and the silicide region 32 is laterally delimited by two electrically insulating spacer elements 34, 36 which each have a base width of e.g. 40 nanometers and partly overlap the connection regions 22 and 24. The spacer elements 34, 36 are also referred to as spacers.

Two isolation trenches 40 and 42 are arranged laterally with respect to the well 20. The isolation trench 40 isolates the connection region 22 from a substrate connection region 44. By contrast, the isolation trench 42 isolates the connection region 24 from a substrate connection region 46. The substrate connection regions 44, 42 are heavily p-doped. Lying beneath the substrate connection region 44 and 46 is a p-doped intermediate region 48 and 50, respectively, which extends as far as the substrate 14. The substrate connection regions 48 and 50 are arranged as near as possible to the capacitor 12, that is to say directly at the n-type well 20.

Two further isolation trenches 52 and 54 delimit the substrate connection region 44 and 46, respectively. The isolation trenches 40, 42, 52 and 54 have a depth of e.g. 250 to 500 nanometers and are also referred to as Shallow Trench Isolation (STI) trenches. The isolation trenches 40, 42, 52 and 54 are filled with an electrically insulating material.

A silicide region 60 extends between the isolation trench 52 and the isolation trench 40 at the surface of the substrate connection region 48. The silicide region 60 is electrically conductively connected to the ground line 18.

A further silicide region 62 extends between the isolation trench 40 and the spacer element 34 at the surface of the connection region 22. The silicide region 62 is electrically conductively connected to the positive line 16.

A next silicide region 64 extends between the spacer element 36 and the isolation trench 42 at the surface of the connection region 24. The silicide region 64 is likewise electrically conductively connected to the positive line 16.

A silicide region 66 extends between the isolation trench 42 and the isolation trench 54 at the surface of the substrate connection region 46. The silicide region 66 is electrically conductively connected to the ground line 16.

To explain the improved ESD protection, an ESD case shall be assumed in which a voltage pulse has a polarity corresponding to the polarity of the voltage which is present at the capacitor 12 in the normal operating mode of the circuit arrangement 10. In the ESD case—as well as in the normal operating mode—a depletion layer 70 is formed which e.g. has a layer thickness. D of a few nanometers, e.g. a layer thickness of two nanometers. On account of the lack of charge carriers, the depletion layer 70 has a dielectric effect with a relative permittivity of twelve ($\in r$ of silicon) and leads to a lower electric field strength in the dielectric 28 since it acts as a capacitive voltage divider connected in series with a gate oxide capacitor.

A system 80 of coordinates represents the potential profile 82 counter to the direction of the normal to the surface of the substrate 14 in the capacitor 12. A y axis 84 of the system 80 of coordinates shows the potential within the range of 0 volts to e.g. 5 volts. An x axis 86 of the system 80 of coordinates shows the spatial coordinate in the capacitor 12 with increasing distance from the silicide region 32. Ground potential, that is to say zero volts, is present in the silicide region 32 and in the gate region 30. The potential rises linearly in the dielectric 28. The potential increases further linearly in the depletion layer 70 20 e.g. to four volts, but with a shallower rise than in the dielectric 28. Because of the depletion layer 70, therefore, the result is a potential rise A outside the dielectric 28 or in other words a reduction in voltage across the dielectric 28.

A system 90 of coordinates represents the field strength profile 92 counter to the direction of the normal to the surface of the substrate 14 in the capacitor 12 A y axis 94 of the system 90 of coordinates shows the field strength E within the range of 0 volts/nanometer to e.g. 2.5 volts/nanometer. An x axis 96 of the system 90 of coordinates shows the spatial coordinate in the capacitor 12 with increasing distance from the silicide region 32. In the silicide region 32 and in the gate region 30, the field strength E is zero volts/nanometer. In the dielectric, the field strength E has a value of e.g. two volts/nanometer. In the depletion layer, the value of the field strength is smaller than in the dielectric 28, e.g. one volt/nanometer. In the n-type well 20, the field strength E is again zero volts/nanometer.

Negative charges 100 and positive charges 102 illustrate the effect of the dielectric 28 and the depletion layer 70 as a capacitor dielectric. Moreover, FIG. 1 illustrates a p-n junction capacitor 104, which is formed by the depletion layer between the n-type well and the substrate 14 and which is connected in parallel with the capacitor 12, so that different types of capacitor are connected in parallel.

In another example arrangement, a metal electrode, e.g. made of aluminum, is used instead of the polysilicon for the gate region 30. In other arrangements, the connection regions 22, 24 are further away from the spacer elements 34 and 36, see FIG. 2, connection regions 22b, 24b.

In some arrangements, the auxiliary doping region 26 extends only in a central region below the dielectric 28, see side edges 110 and 112. The distance between the side edge 110 and 112 of the auxiliary doping region 26 and the closest connection region 22 and 24, respectively, in the case of absent extension regions or the closest extension region is e.g. at least 100 nanometers. The depletion layer 70 is formed thicker below the edge regions of the dielectric 28, which increases the robustness against ESD.

Figure 2:
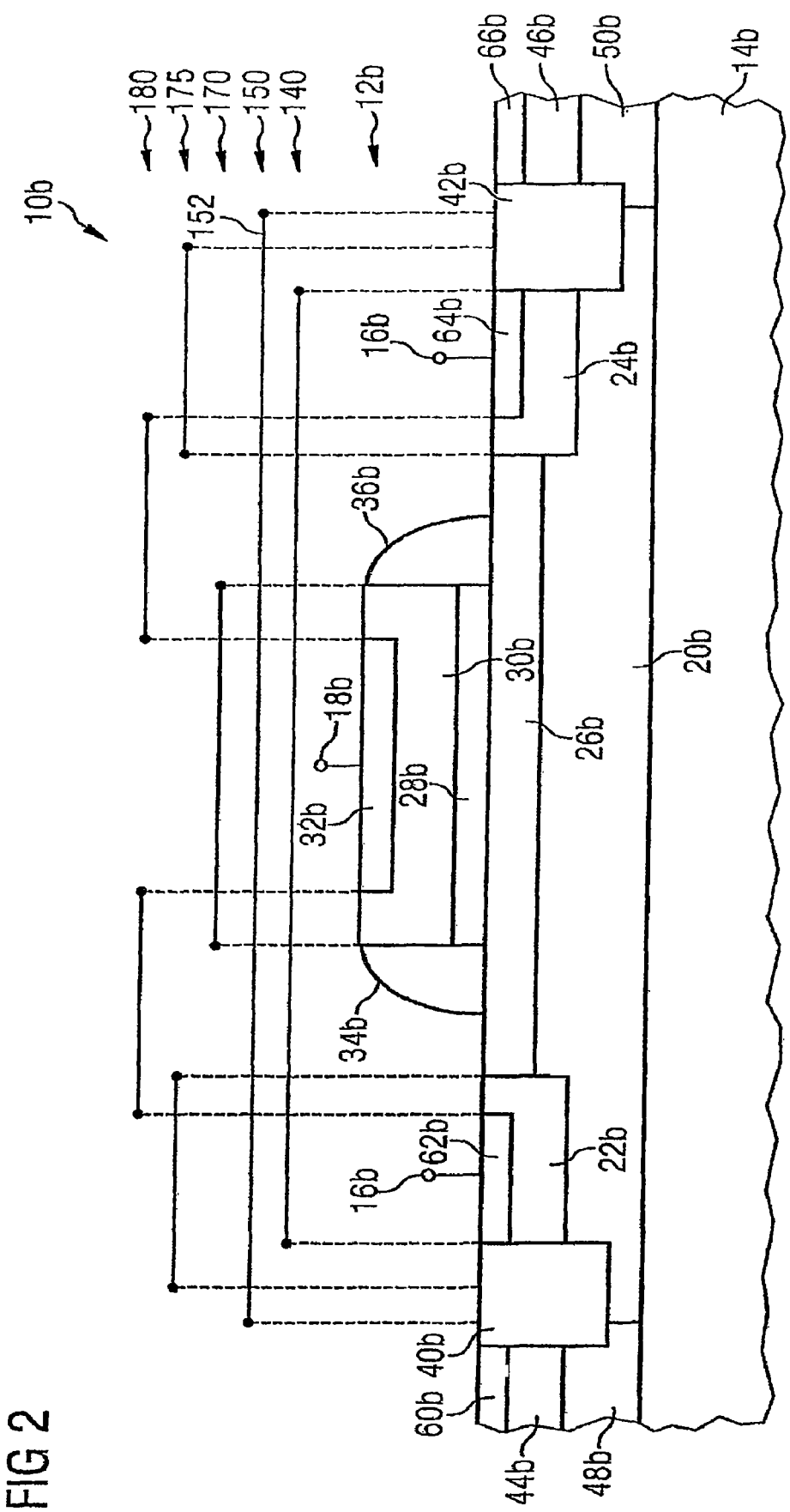
FIG. 2 shows masks which are used during the production of a further r-type well capacitor.

FIG. 2 shows photolithographic masks which are used in the production of an n-type well capacitor 12b of a circuit arrangement 10b in a process with minimum photolithographic dimensions smaller than one micrometer. Apart from the deviations explained below, the same steps as in the production of the capacitor 12b are carried out in the production of the capacitor 12. The circuit arrangement 10b is constructed like the circuit arrangement 10. The n-type well capacitor 12b corresponds to the capacitor 12 apart from the differences explained below, so that identical parts are designated by identical reference symbols, but the latter are followed by the lower-case letter b to differentiate between the two capacitors 12 and 12b.

The capacitor 12b includes a substrate 14b, a positive line 16b, a ground line 18b, a well 20b, connection regions 22b, 24b, an auxiliary doping region 26b, a dielectric 28b, a gate region 30b, a silicide region 32b, spacer elements 34b, 36b, isolation trenches 40b, 42b, substrate connection regions 44b, 46b, intermediate regions 48b, 50b, and silicide regions 60b to 66b.

The capacitor 12b has the following deviations in 30 comparison with the capacitor 12. The connection regions 22b and 24b are arranged at a distance from the spacer elements 34b and 36b, respectively, so that no contact occurs and no overlap occurs as seen in the direction of the normal to the surface of the substrate 14. The silicide regions 62b and 64b do not reach as far as the spacer elements 34b and 36b, respectively, and also cover only a partial region of the connection regions 22b and 24b, and the silicide region 32b likewise covers only a partial region of the gate region 30b.

Because of the set-back connection regions 22b and 24b or LDD regions and also because of the set-back silicide regions 62b, 64b and 32b, in the ESD case there is a reduction of the field strength occurring in the dielectric 28b at the edges of the gate region 30b, as a result of which the breakdown voltage of the capacitor 12b rises. This statement holds true assuming that under the ESD condition a certain current (tunneling current) flows via the gate oxide or the dielectric 28 and additional voltage drops therefore occur with respect to the potential conditions shown in FIG. 1. For the rest, the increased ESD strength and the high area capacitance of the capacitor 12b are based on the relationships explained above with reference to FIG. 1 for the capacitor 12.

In the production of the capacitor 12 and 12b, the position of the active regions and thus also the position of the isolation trenches 40b and 42b are defined with the aid of a mask 140 using a resist. The isolation trenches 40b and 42b are etched, filled and planarized. The n-type well 20b is then implanted, a resist layer (not illustrated) is exposed with a mask 150, the mask structure 152 of which predefines the position of the well 20.

Afterward, with a mask (not illustrated), the position of the auxiliary doping region 26b is predefined with a resist. The resist is developed. After development, the auxiliary doping region 26b is doped with the aid of an implantation. The mask for the auxiliary doping region 26b contains, in the region of the n-type well 20b, a mask structure lying e.g. at the same location as the mask structure 152 in the mask 150. In other regions, however, the two masks have mask structures that deviate from one another. In an example arrangement with a shortened auxiliary doping region as explained with reference to FIG. 1, the mask for the auxiliary doping region 26 defines the position of the edges 110 and 112. The implantation for the auxiliary doping region 26 and 26b is effected simultaneously with implantations for setting the threshold voltage in field effect transistors of the circuit arrangement and 10b, respectively.

The dielectric 28b is subsequently grown thermally on the silicon surface. Afterward, the polycrystalline layer for the gate region 30b is deposited and doped in situ or subsequently, e.g. when carrying out one or more of the implantations, such as an implantation for extension regions, an implantation for the connection regions 22b, 20 24b or some other implantation.

The position of the gate region 30b is then defined with the aid of a mask 170. The polycrystalline layer is then patterned in an etching process, preferably simultaneously with the dielectric 28b.

The implantation for extension regions is carried out at this point in time for the circuit arrangement 10, but not for the circuit arrangement 10b. Prior to carrying out these implantations, in the production of the circuit arrangement 12b, the spacer elements 34b and 36b are produced in a self-aligning manner by layer deposition and anisotropic etching.

After the production of the spacer elements 34b and 36b, a mask 175 is used to define the position of the connection regions 22b and 24b. After the development of a resist, the implantation for the connection regions 22b and 24b and also extension regions (here congruent with 22b and 24b) is carried out.

The production of the connection regions 22b and 24b is followed by the production of the silicide regions 18b and 60b to 66b. For blocking the siliciding in specific regions, blocking regions in which e.g. a previously applied nitride layer is intended to remain are defined with the aid of a mask 180. A thin metal layer of e.g. tens of nanometers is then sputtered onto the wafer surface. Suitable metals are e.g. titanium, cobalt or nickel. During a heat treatment step, the silicide is formed in regions at which the metal makes contact with silicon. The silicide reduces the contact resistance, so that signals at high frequencies can be processed. Afterward, the metal that has not been converted into silicide and the residues of the nitride layer are removed.

The set-back silicide regions likewise reduce the field strength in the dielectric in the vicinity of the edges of the gate region 30b. Experimentally, 0.5 volts higher transient breakdown voltages could be achieved by the silicide blocking. Series resistances thus form which, in the ESD case, counteract tunneling currents that damage the dielectric 28b.

The masks 175 and 180 are not used in the production of the capacitor 12, since no set-back connection regions have to be produced nor is there a need for blocking siliciding. The implantation of the connection regions 22 and 24 and also the formation of the silicide regions 32 and 60 to 66 are carried out in a self-aligning manner with respect to the spacer elements 34 and 36.

In some arrangements, the siliciding is blocked only at a portion of the gate region or only at a portion of the connection regions. In a further example arrangement, a gate region made of metal is used instead of polycrystalline gate region 30b, siliciding being unnecessary on this region.

Figure 3:
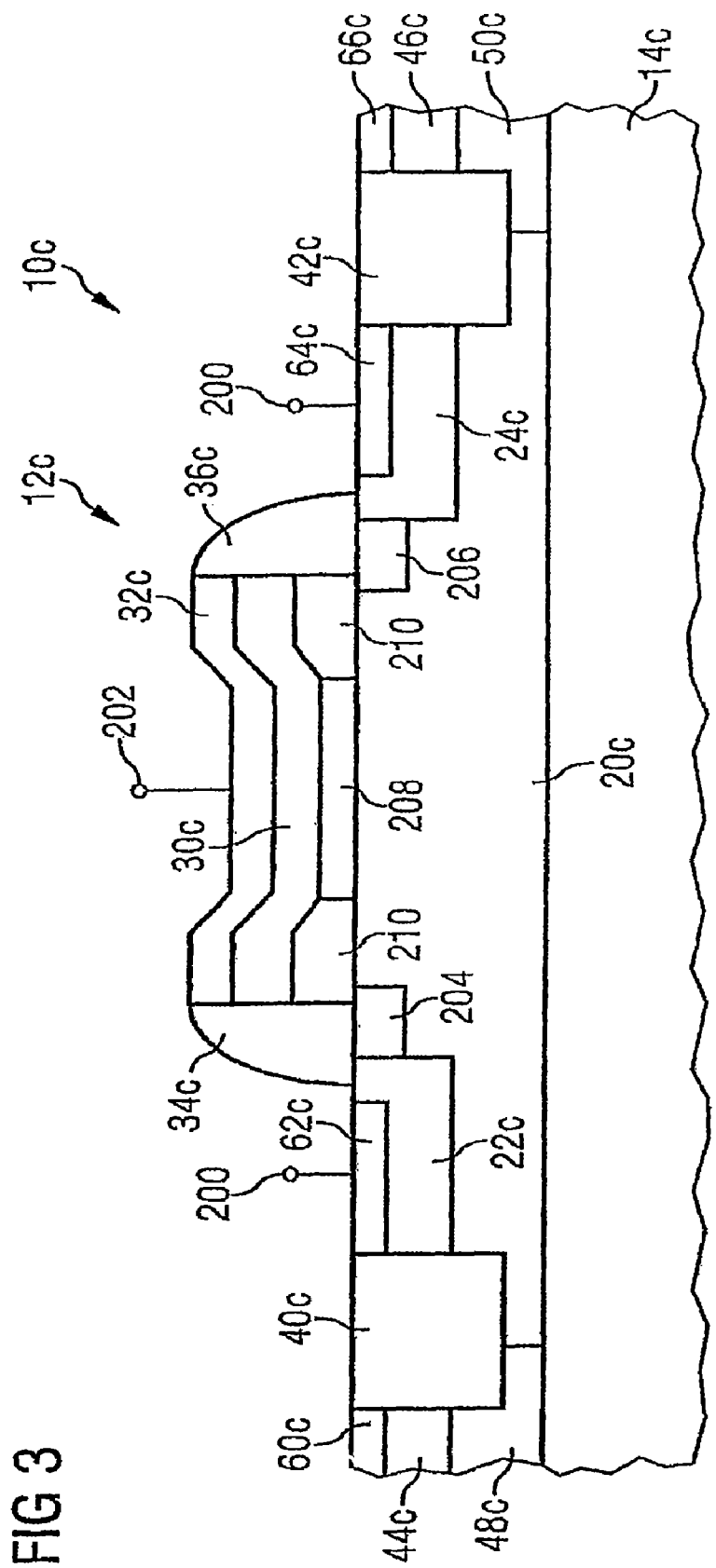
FIG. 3 shows an n-type well capacitor with dual gate oxide.

FIG. 3 shows a circuit arrangement 10c containing an n-type well capacitor 12c with dual gate oxide. The circuit arrangement 10c is constructed like the circuit arrangement 10. The n-type well capacitor 12c corresponds to the capacitor 12 apart from the differences explained below, so that identical parts are designated by identical reference symbols, but the latter are followed by the lower-case letter c to differentiate between the two capacitors 12 and 12c.

The capacitor 12c includes a substrate 14c, a well 20c, connection regions 22c, 24c, a gate region 30c, a silicide region 32c, spacer elements 34c, 36c, isolation trenches 40c, 42c, substrate connection regions 44c, 46c, intermediate regions 48c, 50c, and silicide regions 60c to 66c.

The capacitor 12c comprises an operating potential line 200 that leads to the silicide regions 62c and 64c, an operating potential line 202 that leads to the suicide regions 32c, with the operating potential lines 200 and 202 carrying potentials that are different from one another. The silicide regions 60c and 66c are at ground potential for both types of polarization. Thus, both types of polarization are used as a polarization for which the potential of the operating potential line 202 is greater than the potential of the operating potential line 200.

Illustrated in the capacitor 12c are n-doped LDD regions 204 and 206 or extension regions lying beneath the spacer elements 34c and 36c. The dopant concentration of the LDD regions 204, 206 lies e.g. within the range of $5 \times 10^{18}$ to $1 \times 10^{20}$ dopant atoms per cubic centimeter, and an auxiliary doping region corresponding to the auxiliary doping region 26b is absent in the capacitor 12c. In some systems, however, such an auxiliary doping region is present.

In the capacitor 12c, a dielectric having a thin central dielectric region 208 and a thick edge dielectric regions 210 is present instead of the dielectric 28b having a uniform thickness. The thickness of the central dielectric region 208 corresponds to the thickness of the thinnest dielectric present in the circuit arrangement 10c. The thickness of the central dielectric region 208 is 2 nanometers. The thin dielectric region 208 ensures a high capacitance per unit area of the capacitor 12c.

The thickness of the edge dielectric region 210 corresponds to the thickness of a further dielectric in the circuit arrangement 10c and is 5 nanometers, by way of example. The thick edge dielectric region 210 ensures a high ESD strength of the capacitor 12c.

In other example arrangements, the measures explained with reference to FIGS. 1 and 3 or the measures explained with reference to FIGS. 2 and 3 are combined to increase the ESD strength further.

In other example arrangements, PCAPs are produced instead of the NCAPs explained with reference to FIGS. 1 to 3, given a choice of the respective other doping type in the regions and given opposite polarization of the capacitor. In further example arrangements, connection regions of the other doping type are used with otherwise identical dopings.

Instead of a doped well, use may be made of a doped region on an insulating region, as is the case in Silicon On Insulator (SOI) technology.

It is therefore intended that the foregoing detailed description be regarded as illustrative rather than limiting, and that it be understood that it is the following claims, including all equivalents, that are intended to define the spirit and scope of this invention.

The invention claimed is:

1. A method of operating an integrated circuit arrangement, the method comprising:
    biasing a reference operating potential line to a basic potential; and
    biasing a positive operating potential line to a more positive potential in comparison with the basic potential; wherein
    the integrated circuit arrangement includes a capacitor connected between the operating potential lines, said capacitor including the following regions:
        a basic doping region doped in accordance with a basic doping with a basic doping type and including a region with a maximum dopant concentration;
        at least one connection region doped in accordance with a connection doping with the basic doping type, the maximum dopant concentration of said connection region being higher than the maximum dopant concentration in the basic doping region, wherein said connection region adjoins the basic doping region;
        an electrode region arranged at a distance from the basic doping region; and
        a dielectric arranged between the electrode region and the basic doping region;
    in which either given an n-type basic doping type the connection region is electrically conductively connected to the positive operating potential line and the electrode region is electrically conductively connected to the reference operating potential line, or
    in which case given a p-type basic doping type the connection region is electrically conductively connected to the reference operating potential line and the electrode region is electrically conductively connected to the positive operating potential line.

2. The method of claim 1, wherein the electrode region is doped with a maximum dopant concentration of greater than $1 \times 10^{18}$ dopant atoms per cubic centimeter or in that the electrode region includes a metallic region at its side facing the dielectric.

3. The method of claim 2, wherein the electrode region is doped with a maximum dopant concentration of greater than $1 \times 10^{18}$ dopant atoms per cubic centimeter at a side facing the dielectric.

4. The method of claim 1, further comprising an auxiliary doping region doped in accordance with an auxiliary doping with the basic doping type arranged between the basic doping region and the dielectric, the maximum dopant concentration of said auxiliary doping region being equal to the maximum dopant concentration in the basic doping region or the maximum dopant concentration of said auxiliary doping region being greater than the maximum dopant concentration in the basic doping region.

5. The method of claim 4, wherein the maximum dopant concentration of the auxiliary doping region is at least twice as high as the maximum dopant concentration in the basic doping region, and the maximum dopant concentration of the auxiliary doping region is at most half as high as the maximum dopant concentration in the connection region.

6. The method of claim 4, further comprising at least one further connection region arranged in a manner adjoining the basic n-type doping region, the basic p-type doping region or the auxiliary doping region arranged between the connection regions, and a metallic line connecting the connection regions.

7. The method of claim 1, wherein the connection region is arranged in a self-aligning manner neither with respect to the electrode region or with respect to a spacer element arranged on the electrode region.

8. The method of claim 4, wherein the auxiliary doping region adjoins the connection region or an extension region formed at the connection region, or wherein in that the auxiliary doping region is formed only at a central region of the dielectric and not in an edge region of the dielectric, part of the basic doping region arranged at the edge region.

9. A method of operating an integrated circuit arrangement, the method comprising:

biasing a reference operating potential line to a basic potential; and biasing a positive operating potential line to a more positive potential in comparison with the basic potential; wherein the integrated circuit arrangement includes:

a capacitor connected between the operating potential lines, said capacitor including the following regions:

a basic doping region doped in accordance with a basic doping with a basic doping type and including a region with a maximum dopant concentration;

at least one connection region doped in accordance with a connection doping with the basic doping type, the maximum dopant concentration of said connection region being higher than the maximum dopant concentration in the basic doping region;

an electrode region arranged at a distance from the basic doping region; and a dielectric arranged between the electrode region and the basic doping region, wherein a surface of the dielectric is in contact with a surface of the basic doping region;

in which either given an n-type basic doping type the connection region is electrically conductively connected to the positive operating potential line and the electrode region is electrically conductively connected to the reference operating potential line, or in which case given a p-type basic doping type the connection region is electrically conductively connected to the reference operating potential line and the electrode region is electrically conductively connected to the positive operating potential line.

\* \* \* \* \*